US007061245B2

(12) United States Patent
McQueeney et al.

(10) Patent No.: US 7,061,245 B2
(45) Date of Patent: Jun. 13, 2006

(54) COIL-ON PLUG CAPACITIVE SENSORS AND PASSIVE COIL-ON PLUG DIAGNOSTIC SYSTEM INCORPORATING SAME

(75) Inventors: Kenneth A. McQueeney, Los Gatos, CA (US); Lee M. Snorteland, San Jose, CA (US)

(73) Assignee: Snap-On Incorporated, Pleasant Prairie, WI (US)

( * ) Notice: Subject to any disclaimer, the term of this patent is extended or adjusted under 35 U.S.C. 154(b) by 0 days.

(21) Appl. No.: 10/772,395

(22) Filed: Feb. 6, 2004

(65) Prior Publication Data

US 2005/0174120 A1 Aug. 11, 2005

(51) Int. Cl.
*F02P 17/00* (2006.01)
*G01R 27/26* (2006.01)

(52) U.S. Cl. ....................... 324/402; 324/380; 324/686

(58) Field of Classification Search ........ 324/378–402, 324/686, 687–690; 123/634–636; 700/258
See application file for complete search history.

(56) References Cited

U.S. PATENT DOCUMENTS

| | | | | |
|---|---|---|---|---|
| 3,477,024 | A | 11/1969 | Pelta | |
| 4,013,334 | A * | 3/1977 | Behnke | 439/130 |
| 4,402,481 | A | 9/1983 | Sasaki | |
| 4,825,167 | A * | 4/1989 | Bayba | 324/399 |
| 5,241,274 | A | 8/1993 | Williams | |
| 5,419,300 | A * | 5/1995 | Maruyama et al. | 123/634 |
| 5,461,315 | A | 10/1995 | Kraus | |
| 5,503,132 | A * | 4/1996 | Miyata et al. | 123/630 |
| 5,577,921 | A * | 11/1996 | Philyaw et al. | 439/125 |
| 6,396,277 | B1 | 5/2002 | Fong et al. | |
| 2004/0239331 | A1 | 12/2004 | McQueeney | |

FOREIGN PATENT DOCUMENTS

| | | | |
|---|---|---|---|
| DE | 37 05 692 | A1 | 9/1988 |
| EP | 0 723 078 | A2 | 7/1996 |
| EP | 1 088 989 | A2 | 4/2001 |
| GB | 1 215 655 | | 12/1970 |

* cited by examiner

*Primary Examiner*—Anjan Deb
*Assistant Examiner*—Jeff Natalini
(74) *Attorney, Agent, or Firm*—McDermott Will & Emery LLP

(57) ABSTRACT

A capacitive sensor for a coil-on plug ignition testing apparatus includes a first portion of the capacitive sensor and a second portion of the capacitive sensor, at least one of which has a substantially planar base, and each of which has one or more engagement members projecting downwardly therefrom. One of or both of the first portion and the second portion may be a capacitive element forming a part of the capacitive sensor. The second portion is connected, and is configured to slide relative, to the first portion. A biasing element is disposed between the first and second portions to bias the first portion toward the second portion and to maintain the first portion and second portion in a compressed state. The first portion may be translated relative to the second portion against a bias of the biasing element, to an extended state for securing to a coil-on plug housing. An electrical connector electrically connects the first portion and/or the second portion forming a capacitive element to an output terminal.

11 Claims, 9 Drawing Sheets

COIL-ON PLUG CAPACITIVE SENSORS AND PASSIVE COIL-ON PLUG DIAGNOSTIC SYSTEM INCORPORATING SAME

TECHNICAL FIELD

The disclosure relates to engine analyzers for internal combustion engine ignition systems, and in particular those including coil-on plug or coil-over plug ignitions.

BACKGROUND DISCUSSION

Engine analyzers provide mechanics with a tool for accurately checking the performance of an ignition system as a measure of overall engine performance. Signal detectors ("test probes") are widely used in diagnosing defects and anomalies in internal combustion engines. A test probe may be placed adjacent a test point such as a ignition coil or ignition wire to pick up an ignition signal, and the test probe communicates the signal back to a motor vehicle diagnostic apparatus. Information obtained from the test probe, such as spark plug firing voltage and duration, can help a mechanic determine if a spark plug associated with the ignition coil is functioning properly.

FIG. 1A illustrates a conventional capacitive signal detection system. Ignition coil 110 is a transformer having a very large turns ratio, typically between 1:50 to 1:100, between its primary and secondary windings, which transforms the low voltage in the primary winding provided by the sudden opening of the primary current to a high voltage in the secondary winding. Ignition coil 110 is connected to the center or coil terminal (not numbered) of a distributor cap 114 by an insulated wire 112. High voltage from the ignition coil 110 is distributed from the coil terminal to side, or spark plug, terminals of the distributor cap 114 by means of a rotor which distributes the spark to each spark plug terminal at a predetermined timing in a manner known to those skilled in the art and provided in standard technical manuals. The spark voltage provided to the spark plug terminals is, in turn, provided to a corresponding spark plug 122 via insulated wires 118.

At each cylinder, the resulting electric discharge between the spark plug electrodes produces a spark which ignites a fuel-air mixture drawn or forced into the cylinder and compressed to an explosive state, thereby driving a piston in the cylinder to provide power to an attached crankshaft. Analysis of ignition waveforms to evaluate engine performance can be performed by capacitively coupling a capacitive signal pickup 124 to the spark plug wire 118. The capacitive signal pickup 124 is conventionally wrapped around or clipped to wire 118, at one end, and is connected to measuring device 128 through a wire or coaxial cable 126. The signal measured by the pickup 124 is used, in combination with a conventional capacitance divider circuit, to determine the wire 118 voltage in a manner known to those skilled in the art.

More recently, ignition systems have evolved to one coil per cylinder or one coil per cylinder pair (a direct ignition system (DIS) or double-ended coil-on plug (DECOP)), and may not have any spark plug wire at all. Such spark ignition systems incorporate an ignition coil over each plug or an ignition coil near each plug as shown, for example, in FIG. 1B. High voltage generated at secondary coil 164 by means of primary coil 162 and magnetic iron core 160 is routed through the output of the secondary coil through various conductive elements to a conductive output, such as a spring 169, and to the spark plug (not shown) housed within spark plug cap or extender 170. Igniter 168 is a switch that opens after current has been flowing in the coil. This transient develops a large voltage on the primary which is increased by transformation through the secondary coil.

FIG. 1C shows a coil-over-plug (COP) assembly having ignition coil 140 and spark plug cap or extender 150. A spark plug (not shown) is attached to the bottom of the spark plug extender 150. This arrangement prevents application of the conventional techniques shown in FIG. 1A, since the high secondary voltage conductor is not as easily accessed as the wire 118 of FIG. 1A. For this configuration, a coil-on plug signal detector assembly or sensor 141, such as taught by U.S. Pat. No. 6,396,277, issued on May 28, 2002, and assigned to the common assignee, which is incorporated herein by reference, may be used. The COP sensor 141 includes upper and lower conductive layers (not shown) affixed to and separated by substrate 144. The upper and lower conductive layers act as a signal detector and as a ground plane. The upper layer is conductively coupled to an external signal analyzer device via wire 152, and the ground plane shields a portion of the electric field generated by the coil, attenuating the signal strength to a level usable by conventional analyzers.

The sensor 141 is clipped to the housing of the ignition coil 140 by a clip 147 attached to sensor housing 148. In this arrangement, sensor 141 lies within an electromagnetic field emitted by coil 140 when the coil is transforming primary voltage into high-voltage for use by a spark plug. In operation, low voltage and high current are applied to the primary winding of ignition coil 140 for a predetermined time, and the primary winding generates an electromagnetic field that principally consists of a magnetic field (H). The secondary winding generates an electromagnetic field that is primarily an electric field (E). The lower conductive layer, which is placed adjacent a housing of the coil 140, is brought substantially to ground potential by virtue of such contact. A voltage potential, which could be positive or negative (generally negative for a COP system), is induced or otherwise developed across upper and lower layers 148, and may be measured at or received from the surface of the upper layer or signal detector layer. The voltage observed at the signal detection layer is proportional to the voltage at the terminal end of the secondary coil of coil 140. A signal taken from the signal detection layer may therefore be used in diagnosing ignition spark voltage characteristics, such as spark voltage or burn time, or other problems such as open wires or plugs or fouled or shorted plugs, in a manner known to those skilled in the art.

However, the outputs of such capacitive sensors are sensitive to the placement of the sensor relative to each of the COPs. Even small amounts of sensor movement or location differences between different COP coils can cause a display of erroneous peak voltage outputs for an engine not having any ignition problems.

Thus, despite the advancements realized by present coil-on plug signal detection devices, there remains room for improvement, particularly in the securement of the sensor devices to the COP under test or positive placement of the sensor device relative to the COP under test, to the universality of such means for securement so as to permit application to a number of different COPs, and to the simplification and cost reduction of devices used to condition, transmit, and/or facilitate display of parade patterns.

SUMMARY OF THE DISCLOSURE

In one aspect, there is provided a capacitive sensor for a coil-on plug ignition testing apparatus, which includes a first portion of the capacitive sensor and a second portion of the capacitive sensor, at least one of which has a substantially planar base, and each of which having one or more engagement members projecting downwardly therefrom. One of or both of the first and second portions may be a capacitive element constituting a portion of the capacitive sensor. The second portion is connected, and configured to slide relative, to the first portion. A biasing element is disposed between the first and second portions to bias the first portion toward the second portion and maintain the first and second portions in a compressed state. The first portion may be translated, relative to the second portion against a bias of the biasing element, to an extended state for securement to a coil-on plug housing. An electrical connector electrically connects the first portion and/or the second portion forming a capacitive element to an output terminal.

In another aspect, a magnetic mount capacitive sensor, provided for a coil-on plug ignition testing apparatus, comprises a magnetic mount base, a movable arm rotatably attached to the magnetic mount base, a capacitive sensor rotatably attached to the movable arm, and a conductor connecting the capacitive sensor to an electrical terminal provided on the magnetic mount base.

In yet another aspect, a control circuit for a coil-on plug ignition testing apparatus includes a first circuit region comprising a plurality of input electrical connectors connectable to a first plurality of capacitive sensors and a second circuit region comprising a plurality of input electrical connectors connectable to a second plurality of capacitive sensors, the second circuit region being parallel to the first circuit portion. A capacitor comprising a portion of a capacitive divider is provided in the first circuit region and/or second circuit region, and a potentiometer is in series to the first and second circuit regions to permit attenuation of signals input thereto.

In still other aspects, a coil-on plug ignition testing apparatus is provided which includes a combination of the aforementioned capacitive sensor and/or the aforementioned magnetic mount capacitive sensor with the aforementioned control circuit.

DESCRIPTION OF THE EMBODIMENTS

The embodiments described herein may include or be utilized with any appropriate voltage source, such as a battery, an alternator and the like, providing any appropriate voltage, such as about 12 Volts, about 42 Volts and the like.

Figure 1A:
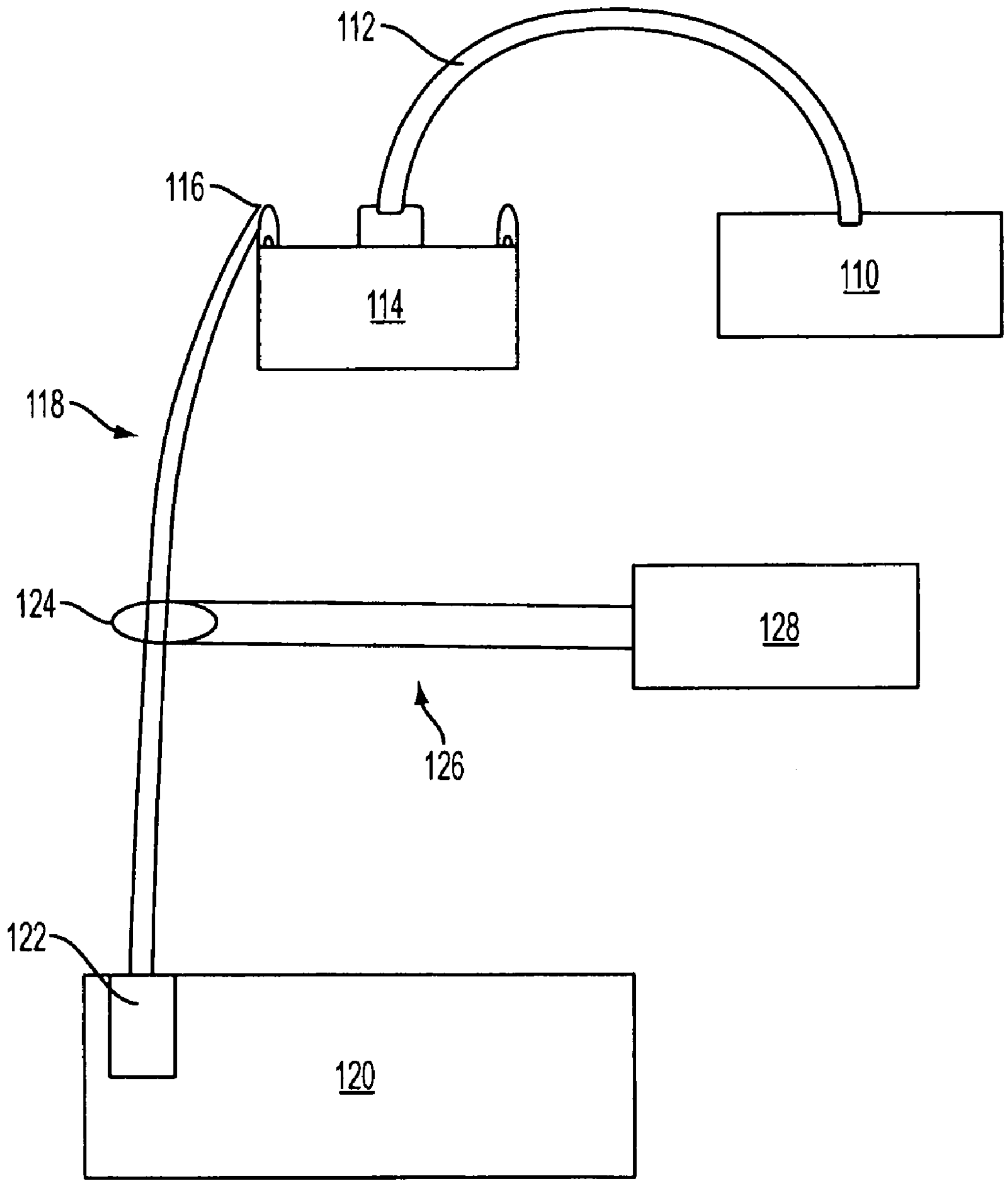
FIG. 1A (PRIOR ART)
FIGS. 1A, 1B, and 1C depict a conventional capacitive sensor and circuit for detecting secondary ignition voltages of a distributor-based ignition system, a coil-on plug (COP) ignition coil with integrated igniter, and another type of COP capacitive sensor placed adjacent a COP.
Figure 1B:
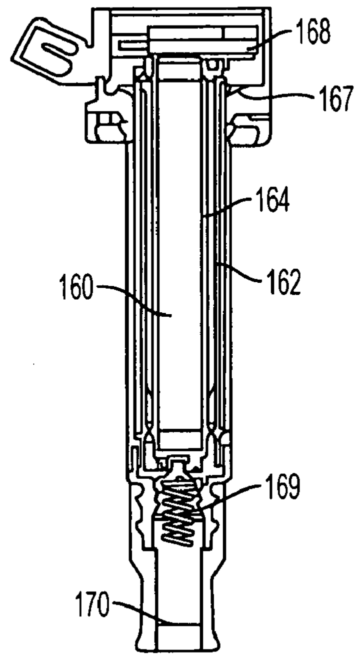
FIG. 1B (PRIOR ART)
Figure 1C:
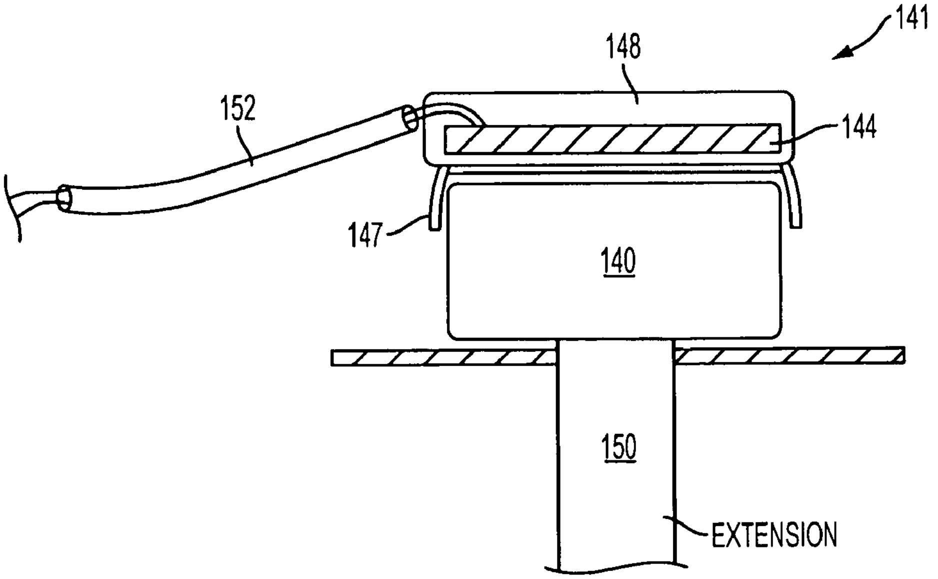
FIG. 1C (PRIOR ART)
Figure 2A:
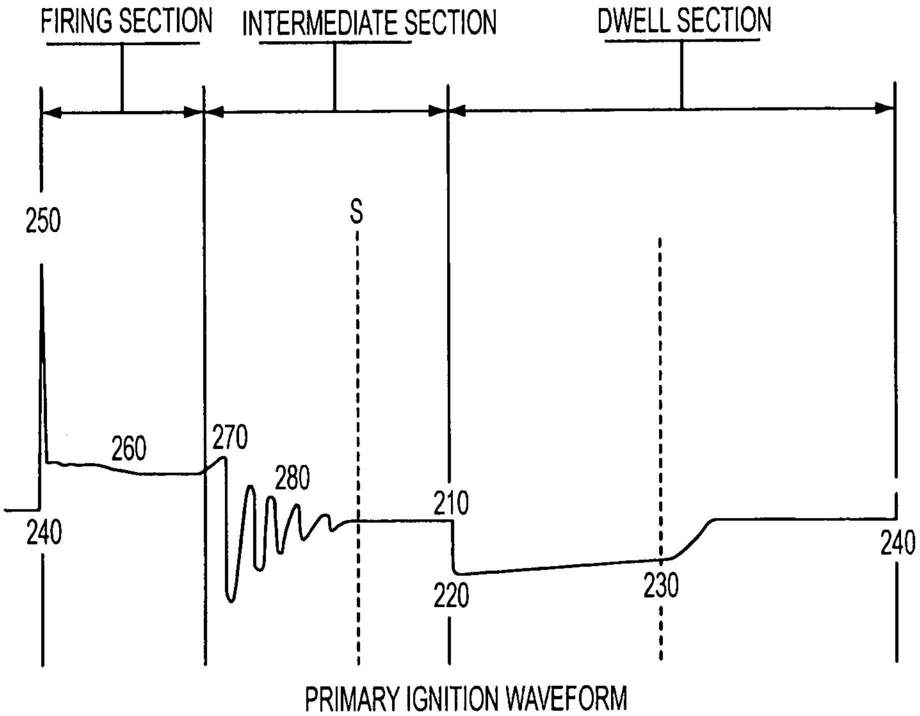
FIGS. 2A and 2B respectively depict a typical primary ignition waveform and secondary ignition waveform displayed as a function of time.
Figure 2B:
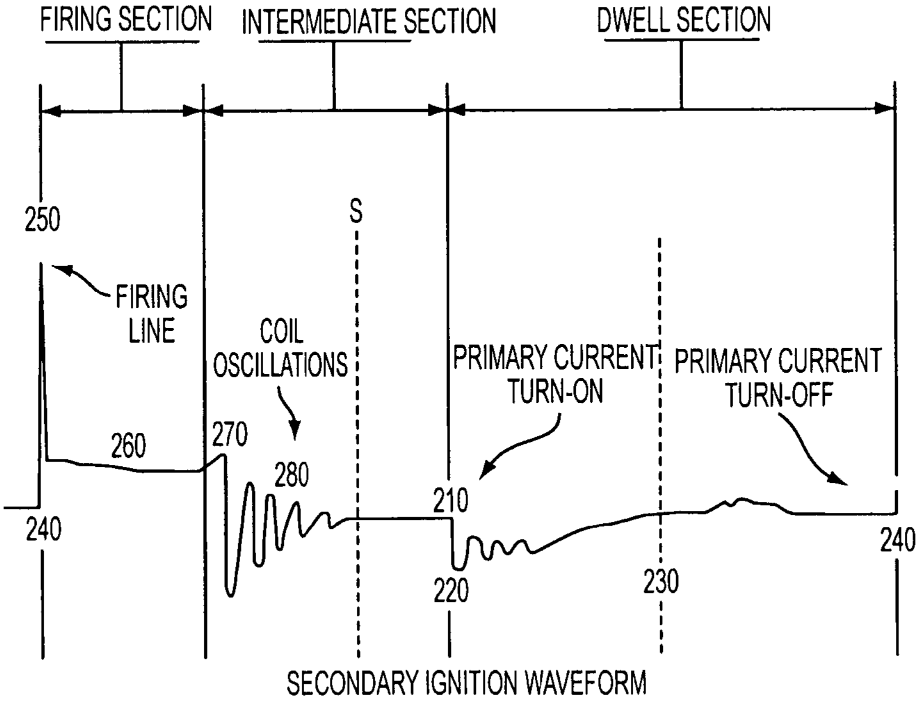

FIGS. 2A and 2B illustrate, respectively, a typical primary ignition waveform and secondary ignition waveform as a function of time. The waveforms have three basic sections labeled Firing Section, Intermediate Section, and Dwell Section.

Common reference numerals are used in FIGS. 2A and 2B to represent common events occurring in the primary and secondary waveforms. At the start S of the waveform, no current flows in the primary ignition circuit. Battery or charging system voltage available at this time generally ranges from approximately 12–15 volts, but is typically between about 12–14 volts. At 210, the primary switching device turns on the primary current to start the "dwell" or "charge" section. At 220, current flows through the primary circuit, establishing a magnetic field in the ignition coil windings. A rise in voltage occurs along 230 indicating that coil saturation is occurring and, on ignition systems that use coil saturation to control coil current, a current hump or voltage ripple appears at this time. The part of the waveform representing primary circuit on-time is between points 210 and 240. Thus, the portion of the signal between points 210 and 240 represents the dwell period or "on-time" of the ignition coil primary current.

The primary switching device terminates the primary current flow at 240, suddenly causing the magnetic field that had built up to collapse and induce a high voltage in the primary winding by self-induction. An even higher voltage is induced, by mutual induction, into the secondary winding, because of a typical 1:50 to 1:100 primary to secondary turns ratio. The secondary voltage is delivered to the spark plug gap, and the spark plug gap is ionized and current arcs across the electrodes to produce a spark 250 (i.e., the "firing line") to initiate combustion and the spark continues for a period of time called the "firing section" or "burn time" 260.

The firing line 250, measured in kilovolts, represents the amount of voltage required to start a spark across the spark plug gap, and is generally between about 6–12 kV. The burn time 260 represents the duration of the spark event, is generally between about 1–3 milliseconds and is inversely related to the firing kV. If the firing kV increases, burn time decreases and vice versa. Over the burn time 260, the discharge voltage across the air gap between spark plug electrodes decreases until the coil energy cannot sustain the spark across the electrodes (see e.g., 270). At 280, an oscillating or "ringing" voltage results from the discharge of the coil and continues until, at 290, the coil energy is dissipated and there is no current flow in the primary circuit.

Figure 3A:
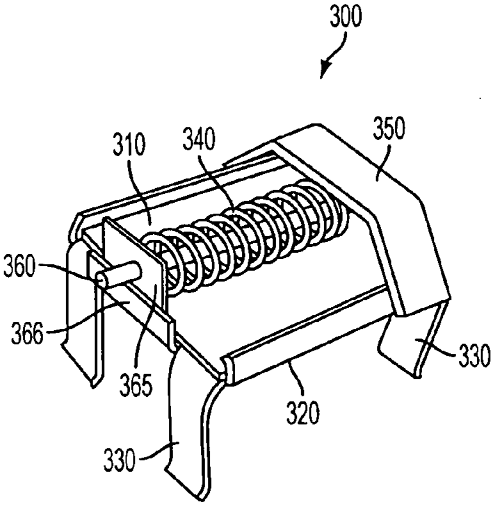
FIGS. 3A, 3B, 3C and 3D show aspects of capacitive sensors in accord with the present concepts including, in FIG. 3C, a view of the capacitive sensor of FIGS. 3A and 3B installed on a housing of a coil-on plug.
Figure 3B:
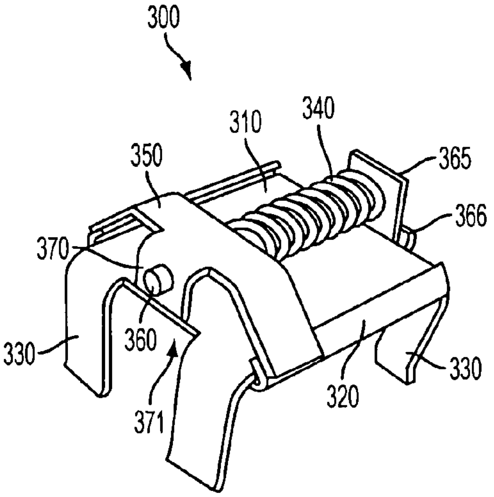
Figure 3C:
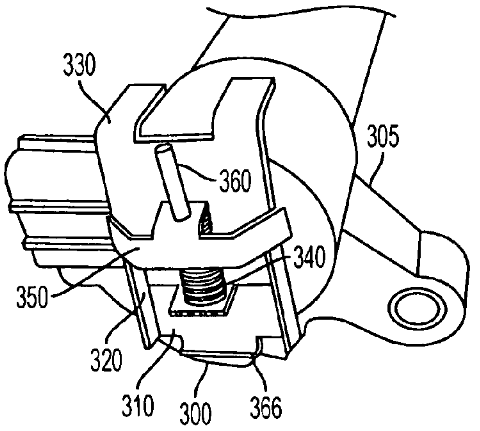
Figure 3D:
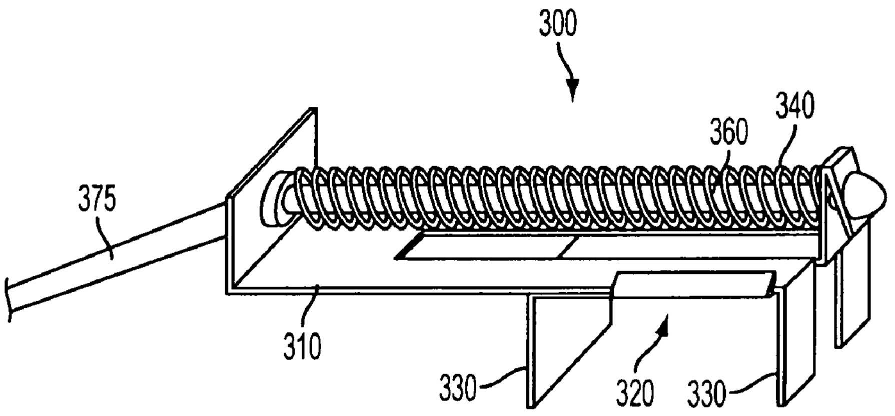

One aspect of a capacitive sensor 300 in accord with the present concepts is shown in FIGS. 3A, 3B, 3C and 3D. FIG. 3C shows the capacitive sensor 300 of FIGS. 3A and 3B installed on a housing 305 of a coil-on plug (COP). FIG. 3D shows another example of a capacitive sensor 300 in accord with the present concepts. Although the capacitive sensor 300 of FIG. 3D is generally similar to the examples in FIGS. 3A, 3B and 3C, the capacitive sensor is formed from fewer pieces or stampings, two stampings as opposed to three stamping in the example of FIGS. 3A, 3B and 3C and is thus more economical to produce while retaining full functionality.

Whereas conventional capacitive sensors (e.g., 124) are clipped to the spark plug cables (e.g., 118), as discussed above, capacitive sensor 300 is configured for a positively biased coupling to the housing 305 of the COP. A first portion 310 (e.g., an upper portion) of the capacitive sensor 300 is configured to slide relative to a second portion 320 (e.g., a lower portion) of the capacitive sensor. In one aspect, each of the first portion 310 and the second portion 320 of the capacitive sensor themselves comprise a portion of the capacitive sensor (i.e., a first capacitive portion and a second capacitive portion). However, it is not necessary that each of the first portion and the second portion of the capacitive sensor comprise a portion of the capacitive sensor. Included with the present concepts are a first portion 310 which comprises a portion of the capacitive sensor and a second portion 320 which does not comprise a portion of the capacitive sensor. In this respect, the second portion 320 could comprise any non-conductive material such as, but not limited to, glass-epoxy composite (e.g., FR-4), polymers, ceramics, phenolic, polymides, PTFE, GETEK laminates, plastics, fiberglass, resins, PC board, or combinations or laminates of such materials, or could comprise metal, so long as the second portion 320 is electrically isolated from the first portion 310.

In the example of FIGS. 3A, 3B, 3C and 3D, each of the first portion 310 and the second portion 320 of the capacitive sensor has at least one engagement member 330 to grip the COP housing 305 along opposing sides. In this example, the first portion 310 and the second portion 320 each has two downwardly projecting engagement members 330. However, a lesser or greater number of engagement members could be provided on one or both of the first portion 310 and the second portion 320 and the engagement members could take on any shape or form suitable for imparting a laterally biasing force to a COP housing sufficient to retain the sensor in place during a test.

A spring 340 or similarly adapted biasing element, such as a durable rubber band, is provided to bias the first portion 310 toward the second portion 320 and thereby maintain the first portion and second portion in a substantially closed state. The biasing element, such as spring 340, may be a compression spring or a tension spring in accord with a desired arrangement of fixed and movable anchorage points of the spring. In the examples illustrated in FIGS. 3A–3D, spring 340 is a tension spring. FIGS. 3A–B and D show spring 340 in an extended state prior to installation. As first portion 310 and second portion 320 are expanded outwardly by an external force to translate the first portion relative to the second portion, spring 340 is further compressed, as shown in FIG. 3C, providing a force sufficient to attach the capacitive sensor 300 to a COP housing 305 through engagement members 330.

The first portion 310 and the second portion 320 may then be expanded by an external force or bias to cause relative movement or translation of the first portion relative to the second portion to provide a sufficient clearance between the opposing engagement members to permit installation of the capacitive sensor 300 on a target COP housing 305. Such external force or bias, in the illustrated example, may be imparted by pressing a thumb against the first stop plate while pressing the opposing end of the cross-member 350 with the index and middle finger of the same hand. The spring constant of the spring may, of course, be selected to permit such one handed operation may further include any constant that is at least sufficient to secure the capacitive sensor to the COP housing. Once the capacitive sensor 300 is properly placed, the compressive force of the spring (or like member) 340 draws the first portion 310 and second portion 320 toward each other to the extent permitted by the COP housing 305, to thereby secure the engagement members 330 to the COP housing.

In the illustrated example, an optional guide rod 360 is shown to be disposed within the coils and along a length of the spring 340 to help maintain alignment of the spring. End portions of the guide rod 360 are provided with stop plates 365, 370 against which the respective ends of the spring 340 act. These stop plates 365, 370 may then be constrained from outward lateral movement at outer ends of the first portion 310 and second portion 320 by physical barriers, such as upturned lips or tabs 366, 371. Alternatively, such barriers may singly or both be formed as part of the respective first and/or second portions 310, 320, or may be fixed in place such as by welding. If a guide rod 360 is used, one stop plate 365, 370 should contain a through hole within which the guide rod may translate. In the illustrated embodiment, the cross-member 350 and the second stop plate 370 are integrated and a hole is provided in the second stop plate to permit passage of the guide rod 360.

The cross-member 350, having a curved or U-shaped profile in the example of FIGS. 3A, 3B and 3C, may optionally travel within or along a guide, grooves, or track formed in or by the first portion 310 and/or second portion 320. This cross-member 350 is optional and is not included in the example shown in FIG. 3D.

As shown in FIG. 3D an output lead 375 is connected to the capacitive sensor 300 at a base of the fixed guide rod 360 which passes through the spring 340 coil, such as shown in the example of FIGS. 3A, 3B and 3C. The output lead terminates, at a distal end, in a conventional connector, such as a male RCA connector (mRCA) or female RCA connector (fRCA). The output lead 375 may, however, be connected to any portion of the capacitive sensor 300.

Since the output of the capacitive sensor 300 would be compromised by an inadvertent grounding or touching of the sensor to an engine component, for example, exterior surfaces of the capacitive sensor or portions thereof may be optionally coated with a non-conductive material or finish, such as but not limited to rubber or a resin. Thus, a non-conductive coating may be applied, for example, to the whole of the first portion 310 and the second portion 320 or only portions thereof. Such non-conductive coating is not required and may be omitted in favor of added care by the technicians using such device.

Moreover, this aspect of the capacitive sensor 300 is capable of numerous embodiments. The capacitive sensor may, for example, be configured for placement on recessed COP housings by rearrangement of the engagement potions 330 and inward displacement of the points at which the technicians fingers are placed (e.g., 350) to permit adequate room for the technician to place the device within the confines of the work environment.

Figure 4:
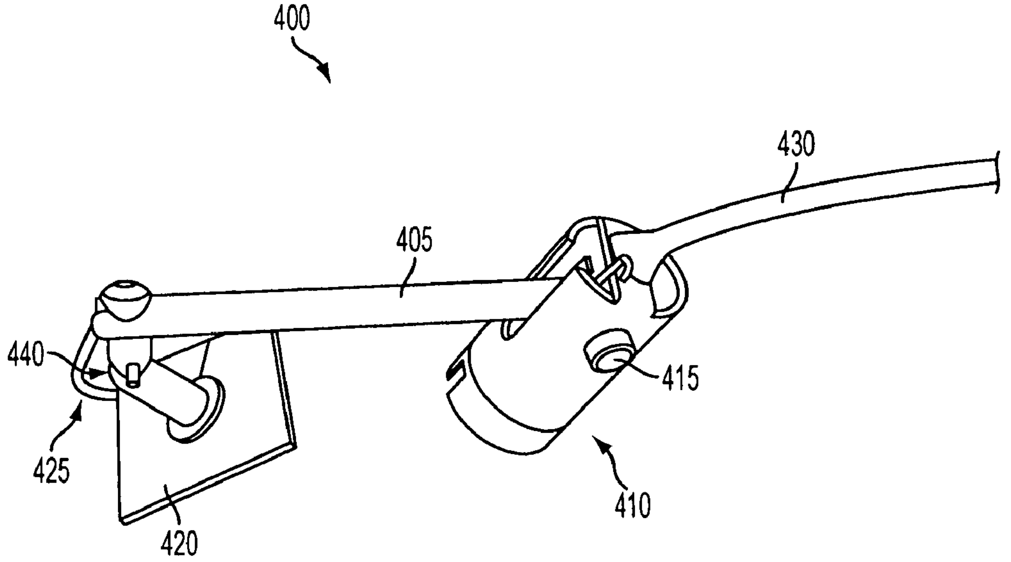
FIG. 4 shows aspects of another capacitive sensor in accord with the present concepts.

Another aspect of a capacitive sensor in accord with the present concepts is shown in FIG. 4, which shows a capacitive sensor 400 having a movable arm 405 and a magnetic mount base 410. Magnetic mount base 410 comprises, in the aspect shown, a hollow cylinder having a magnet mounted therein so as to be recessed within the cylinder. This configuration, having an outside diameter of about 0.512", is particularly adapted to mount on the top of a bolt head within the engine compartment and the degree to which the magnet is recessed within the cylinder corresponds to the height of such bolt head. Although any conventional magnet may suffice, it is preferred to use a Neodymium (e.g., Neodymium Iron Boron) or Samarium Cobalt, magnet having an outside diameter of about 0.50". Still further, a toroidal magnet may advantageously be used in the above configuration in lieu of a cylindrical magnet so as to enable the magnetic mount base to self-center itself over a bolt head owing to the arrangement of magnetic flux lines through the toroidal magnet. The magnet size, shape, and material is variable within the simple constraints of firmly adhering to a work surface (e.g., a bolt head) and being removable with a reasonable amount of force (e.g., 3 lbf–30 lbf, but not limited thereto).

The magnetic mount base 410 may, for example, be configured to adhere to a flat surface, as opposed to a bolt head. Accordingly, the magnet may serve as a pedestal of the magnetic mount base, wherein the "lower" surface of the magnet is adapted to adhere to a flat surface and wherein a single-axis (e.g., z-axis) or multi-axis (e.g., x-axis, y-axis, z-axis) connector for the movable arm is provided on an "upper" surface thereof. The magnet could comprise a square, rectangular, circular, or ring magnet, for example.

In lieu of the positive connection of the capacitive sensor to the COP housing, as in the example provided in FIGS. 3A, 3B and 3C, the capacitive sensor 400 of FIG. 4 is mounted in the engine compartment in the general vicinity of a selected COP housing. The movable arm 405, which may comprise one or more articulated (jointed) and/or telescoping sections, may then be moved or rotated along a first plane (e.g., up and down) and/or a second plane (e.g., side to side).

In the illustrated example, movable arm 405 is rotatably connected to a pin or shaft 415 fixed within the magnetic mount base 410. Alternately, movable arm 405 may be fixed to a rotatable pin or shaft 415 provided within the magnetic mount base 410. Although movable arm 405 is not itself adapted to move along a second plane in the illustrated example, magnetic mount base 410 may be rotated as desired to appropriately position movable arm 405 along the second plane. A capacitive element 420 is provided on a variable position capacitive sensor mount 440 on the distal end of the movable arm 405 and is itself movable with respect to the movable arm by means of the capacitive sensor mount. A wire 425 is connected to the capacitive sensor 400 and extends through movable arm 405, which is hollow in the illustrated example, and into magnetic mount base 410 so as to connect the capacitive element 420 to a terminal (not shown) within the magnetic mount base.

The capacitive element 420, in the illustrated example, is a square piece of PC board or similar non-conductive substrate material, such as described above, having a conductive film or layer such as, but not limited to a copper metallization, provided on an upper surface 401 and on a lower surface 402. The capacitive element may comprise any conductive material and may assume any shape (e.g., round, rectangular, etc.) or degree of curvature (e.g., flat or curved). The upper conductive material 401 is electrically isolated from the lower conductive material 402. A wire 425 electrically connects the lower conductive material 402, which functions as the active side of the capacitive sensor 400, through the movable arm 405 to the electric terminal (not shown) within the magnetic mount base 410. Likewise, the upper conductive layer 401, which functions as the ground side of the capacitive sensor 400, is electrically connected through the movable arm 405 and capacitive sensor mount 440 (if conductive) and/or wires, to the electric terminal (not shown) within the magnetic mount base 410.

As illustrated, the capacitive element 420 element is approximately one square inch in area so as to improve the flexibility in application of the capacitive sensor 400 to any configuration of COP housing. In other words, it is easier to find a 1" square flat portion on an arbitrary COP housing than it is to find a 2" square portion. The capacitive sensor 400 may advantageously include smaller or larger areas. For example, a ⅛ $in^2$ capacitive sensor was found to provide suitable output signals for a wide variety of coils.

Additionally, the capacitive element 420 may be removable from the variable position capacitive sensor mount 440 by means such as, but not limited to, a threaded connection, to permit the capacitive element to be exchanged with a capacitive element of another shape or size. For such configuration the electrical connections between the upper conductive layer 401 and the lower conductive layer 402 must be adapted for disengagement and reconnection using suitable conventional electrical connectors. Such conventional electrical connectors should be implemented in such a manner so as to maintain a smooth lower conductive layer 402, whether it be flat or curved, to provide a substantially flush engagement between the capacitive sensor 420 and the coil housing of interest.

In another aspect, a plurality of different capacitive elements 420 or having different areas and/or shapes may be provided (e.g., rotatably provided) as a capacitive element head unit at the end of the movable arm 405. Depending on the desired capacitive element, a technician may rotate or move a selected capacitive element set into position. Moreover, the capacitive element head unit may itself be removable by means such as, but not limited to, a threaded connection, so as to permit replacement of the capacitive element head unit with another capacitive element head unit.

An output lead 430 is connected to the magnetic mount base 410 terminal (not shown), such as shown in the example of FIG. 4. The output lead terminates, at a distal end, in a conventional connector, such as a mRCA or fRCA.

In a preferred aspect, the aforementioned capacitive sensors (e.g., 300, 400) may be connected, via a control module 600 described below with reference to FIGS. 6(*a*) and 6(*b*), to a battery powered handheld device such as, but not limited to, the Snap-On® MODIS™ system, as described below. Alternatively, a conventional lab scope could be used. If a scope other than the MODIS™ is used, the scope should provide "cylinder clocking" (display independent of time), internal and external triggering for the No. 1 cylinder (or other arbitrarily selected cylinder, such as but not limited to the No. 4 or No. 6 cylinder), a third scope channel for flexible triggering options, vertical calibration of the firing line (in kV), and should possess suitable adapters for input connections other than sheathed bananas.

Figure 6A:
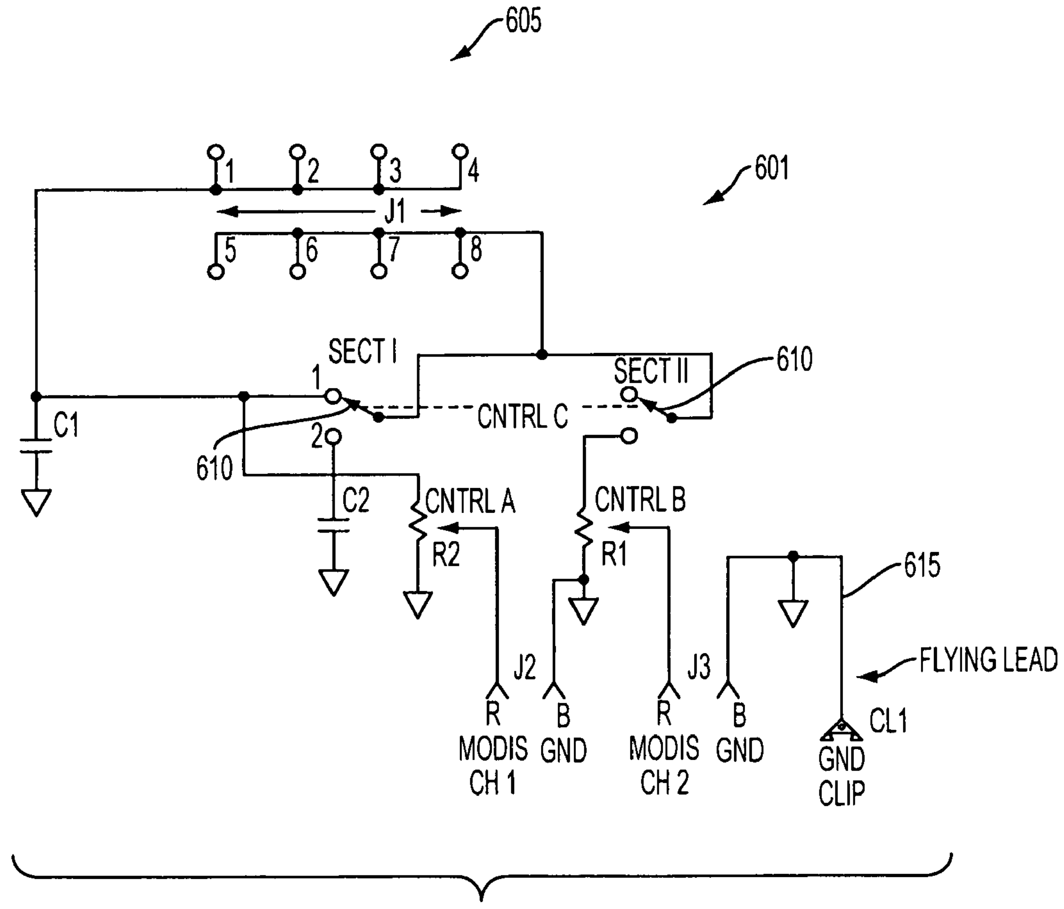
FIGS. 6A and 6B, respectively, show a circuit diagram of a circuit advantageously implementing the aforementioned capacitive sensors and an exemplary control box housing such circuit and depicting the input and output connections and controls.
Figure 6B:
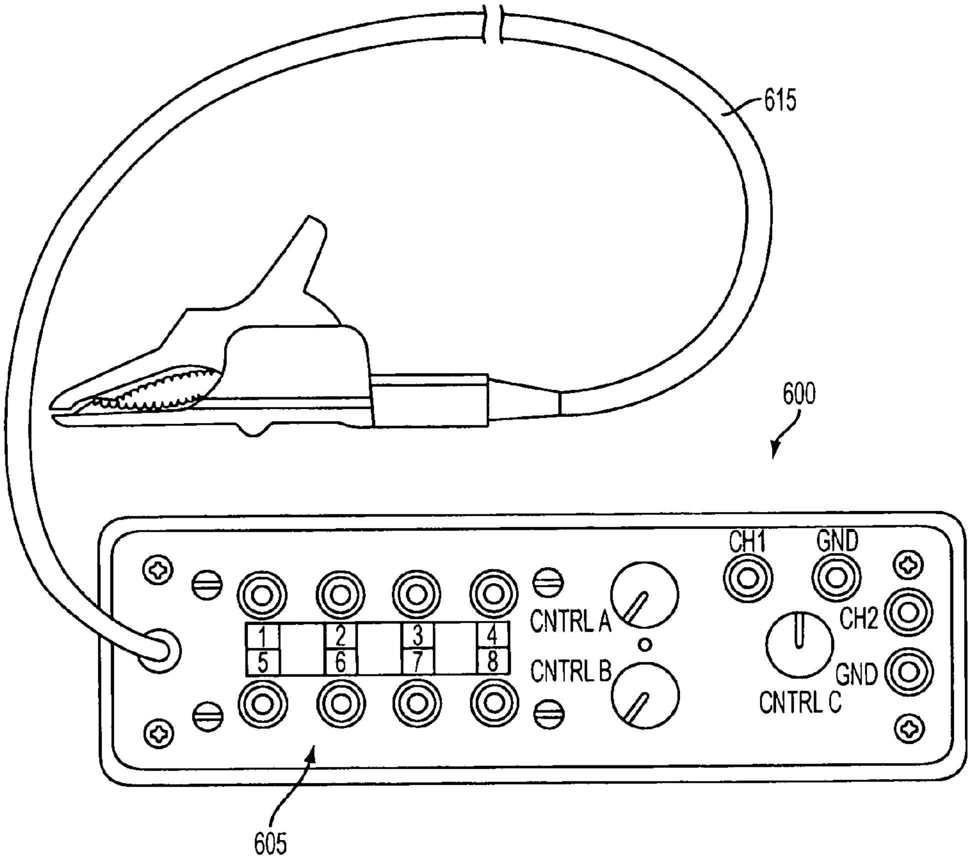

FIG. 6A shows a circuit diagram of a circuit 601 advantageously implementing the aforementioned capacitive sensors (e.g., 300, 400), whereas FIG. 6B shows an exemplary control module 600 housing the circuit of FIG. 6A depicted the input and output connections, as well as control switches. As illustrated, control module 600 and associated circuit 601 comprise an octal RCA assembly 605, such as a Radio Shack 274-0370, enabling connection of the control module/circuit to eight capacitive sensors by means of the capacitive sensor outlet lead RCA connectors. Control module 600 circuit 601 could alternatively comprise a greater (e.g., 12) or lesser (e.g., 4) number of RCA connectors or comparable electrical connectors. Each of the capacitive sensors (e.g., 300, 400) is connected to a respective one of the J1 RCA terminals by a conventional mRCA connector. In one aspect, the capacitive sensors (e.g., 300, 400) comprise a pigtailed outlet lead several inches long terminating in a fRCA connector. The fRCA connector may then be connected to an extension cable, such as a 5' extension cable having mRCA connectors at both ends, to effect connection between the capacitive sensor (e.g., 300, 400) and the control module 600 circuit 601.

Ganged switches 610, controlled by CNTRL C in the control module 600, are placed in switch position 1, as shown, when testing a conventional COP using the aforementioned capacitive sensors (e.g., 300, 400) (or when using a conventional push-on clip around a spark plug wire) since the polarity of all of the inputs are the same (e.g., negative). Switch position 1 incorporates a capacitor C1 as a capacitive divider and a potentiometer R2, which connects to MODIS™ Channel 1, with sensors/cylinders 1–4 and 5–8 in parallel (all signals are negative). Ganged switches 610 are placed in switch position 2 when testing a DIS system with a conventional push-on clip or when testing a DECOP system with the capacitive sensors described herein. In switch position 2, negative polarity signals are input to terminals 1–4 and positive polarity signals are input to terminals 5–8. Switch position 2 incorporates capacitor C2 as a capacitive divider and a potentiometer R1. The negative inputs to terminals 1–4 are output to potentiometer R2 and the positive inputs to terminals 5–8 are output to potentiometer R1, which is connected to MODIS™ Channel 2.

Capacitors C1 and C2 are 4700 pF, 50V ceramic capacitors. These capacitors comprise a portion of the denominator of a capacitive divider, whereas the capacitance ($C_S$) of the capacitive sensors comprises the numerator of the capacitive divider, the capacitive divider being generally represented, for example, by $V_{OUT}=V_{IN}*C_S/(C_S+C_1)$ in the depicted arrangement with switch 610 in position 1. Capacitors C1 and C2 provide, in the noted example, a large capacity denominator. Alternatively, any reasonably valued capacitor may be used to yield a division ratio that is greater than 1:1 and preferably greater than 2:1. Still more preferably, the division ratio is between about 500:1 to about 1000:1. The function of the capacitive divider is simply to provide a manageable lower voltage for the passive, potentiometer-based circuit to maintain a suitable waveform for viewing and analysis. Any division ratio may be selected in accord with the remainder of the attendant circuit to achieve the same end. Moreover, in other embodiments, one of or both of capacitors C1, C2 could be omitted from the control module 600.

If it is desired only to monitor negative going signals, such as provided in conventional COP or conventional coils, C2 may be omitted, as a separate circuit path is not required for positive going signals. If it is desired to monitor both negative and positive going signals, C1, C2 could be replaced by network cables connecting the capacitive sensors to the control module and provided with a junction bearing internal capacitive divider elements. However, the cost of a plurality of network cables is greater than the cost of the integrated capacitors C1, C2 in the disclosed example. If the capacitive divider were omitted entirely, the output would not yield a usable or meaningful waveform. Of particular interest in the exemplary circuit is the ability to provide a combination of capacitive divider and potentiometer which yields a firing line of a height commensurate with a value that falls within a normal range expected by technicians in the field (e.g., about 10 kV). For example, although the control module could be configured to output firing lines of approximately 40 kV in accord with the present concepts, this value is outside of the typically expected range and may possibly engender some confusion on the part of technicians who may have been conditioned or taught to consider a 40 kV signal as indicating a problem.

Once the signal has been conditioned by the capacitive divider, it is passed through a potentiometer (e.g., R1, R2) to permit further attenuation of the signal. In the illustrated example, the potentiometers R1, R2 are 250kΩ and are connected to MODIS™ channel 1 sheathed red banana jack J2 and MODIS™ channel 2 sheathed red banana jack J3, respectively. MODIS™ channel 1 and MODIS™ channel 2 are also respectively controlled by CNTRL A and CNTRL B, the positions of which during operation are described above.

A flying lead is also optionally provided with an alligator-type ground clip 615, as shown in both FIGS. 6A and 6B, so as to ensure an effective ground for the control module 600 internal grounds. The ground clip 615 is advantageously grounded to the vehicle or motor metal.

By providing the type of non-active amplitude control described above, some distortion may take place in the sparkline region of the output waveform. The reason for this is that the active COP coil (the one delivering a signal) acts as a voltage source which is capacitance coupled, by means of the attached sensor, to the top end of a potentiometer. The swinger is connected to all inactive sensors and the capacity to ground that they represent. The net effect is a high-pass filter connected to the output of the active sensor, which could reduce the displayed sparkline voltage. The end of the sparkline marker (burntime) is preserved.

Nothing of consequence is lost by the distortion in the sparkline region. As previously noted, the sparkline is a voltage starting immediately after the firing line (power kV) and ends coincident with the end of burntime (spark duration). The sparkline voltage is not normally constant and may be higher or lower at the end than at the beginning or may be the same. Sparkline is measured at the top of a spark plug with respect to ground and typically has a value in the range of 2–4 kV. This voltage is not the same as the voltage across the plug gap because a resistor (e.g., 5000Ω) is built into virtually every plug manufactured today. The plug gap voltage is typically 50–200 V and is largely dependent upon what is happening in the vicinity of the gap during the combustion process. The current flow into the plug during combustion can therefore be estimated, using median values of the above ranges, as I=(3000−100)/5000 (neglecting resistance of arc), yielding a current of about 0.58 amp at the beginning of sparkline. As can be seen, there is practically no difference in the sparkline whether or not the plug gap is shorted (fouled). If the plug gap goes to zero, then neither the voltage across the plug nor the current flow is changed significantly. The rise or fall of the sparkline during combustion (slope) is primarily a function of how much of the spent gases combine with the remaining fuel air mixture and is influenced by other variables such as combustion chamber geometry, placement and cooling of the plug, installed smog components, etc., which are not within the control of a diagnostician. Thus, normal differences in sparkline from cylinder to cylinder can themselves mask the differences due to faults. The plug resistor value is also not carefully controlled, since the resistor is included primarily for noise suppression, and can vary even for plugs from the same manufacturer. Accordingly, there is often a variance in the sparkline between cylinders also for this reason.

Therefore, the aforementioned control module 600 bearing a passive potentiometer (e.g., R1, R2) which does not require external power, yields an improvement in cost, flexibility, and simplicity over control or modulation arrangements using active elements requiring external power. This improvement is realized without the loss of meaningful data, such as firing line (power kV) or burntime. The aforementioned capacitive sensors (e.g., 300, 400) may be used with almost any conventional lab ignition scope and is particularly suited to those having a 10 MΩ input impedance and triggering abilities. The aforementioned control module 600 may be used with any capacitive sensors, including the conventional capacitive clips traditionally used on spark plug or ignition wires, to provide a parade pattern display without active components, a novel improvement and advancement over prior devices which required active components.

With reference to FIGS. 6A and 6B, capacitive sensors (not shown) are connected to substantially similar positions on respective COPs. The outputs from the capacitive sensors are then connected to inputs in the control module and outputs therefrom are then connected to the selected lab scope or MODIS™ system, as described below. For a conventional COP, the capacitive sensors described above are connected, via the aforementioned output leads, to the inputs J1-1 through J1-8 of the control module, in correspondence to the number of capacitive sensors required for the vehicle (e.g., 8 sensors for an 8-cylinder vehicle). On the control module 600, the technician should set the CNTRL C to 1, use CNTRL A to set level, set each level to 10 kV, whether positive, negative, or both, and the ground (GND) clip should be clipped to motor metal.

For a DIS system, the capacitive sensors described above connected to the negative firing lines are connected to J1-1 through J1-4 and the capacitive sensors connected to the positive firing lines are connected to J1-5 through J1-8. On the control module 600, the technician should set the CNTRL C to 2, use CNTRL A to set negative level and CNTRL B to set positive level, set each level to 10 kV, whether positive, negative, or both, and the ground (GND) clip should be clipped to motor metal.

Finally, for a DECOP system, the capacitive sensors described above connected to the negative firing lines are connected to J1-1 through J1-4 and the capacitive sensors described above connected to the positive firing lines are connected to J1-5 through J1-8. On the control module 600, the technician should set the CNTRL C to 2, use CNTRL A to set negative level and CNTRL B to set positive level, set each level to 10 kV, whether positive, negative, or both, and the ground clip should be clipped to motor metal.

Triggering from the No. 1 cylinder is recommended to provide a meaningful display and can be accomplished in several ways including (1) using the MODIS™ RPM clamp, an inductive sensor which detects current triggers of either positive or negative polarity, around the primary wires to the No. 1 COP coil, or plug wires for DIS or Hybrid (external triggering); (2) using a kV clip and cable (male RCA to bananas) and using Ch. 3 to trigger internally from that trace; (3) backprobing external ignitor input (e.g., 12 V signal) to coil to drive Ch. 3 and using internal triggering from that trace, making certain that scope input range will accommodate the high voltage present; or (4) backprobing the drive signal of the on-board computer (e.g., a 5V signal) for the internal ignitor to drive Ch. 3 and using internal triggering from that trace.

Figure 5:
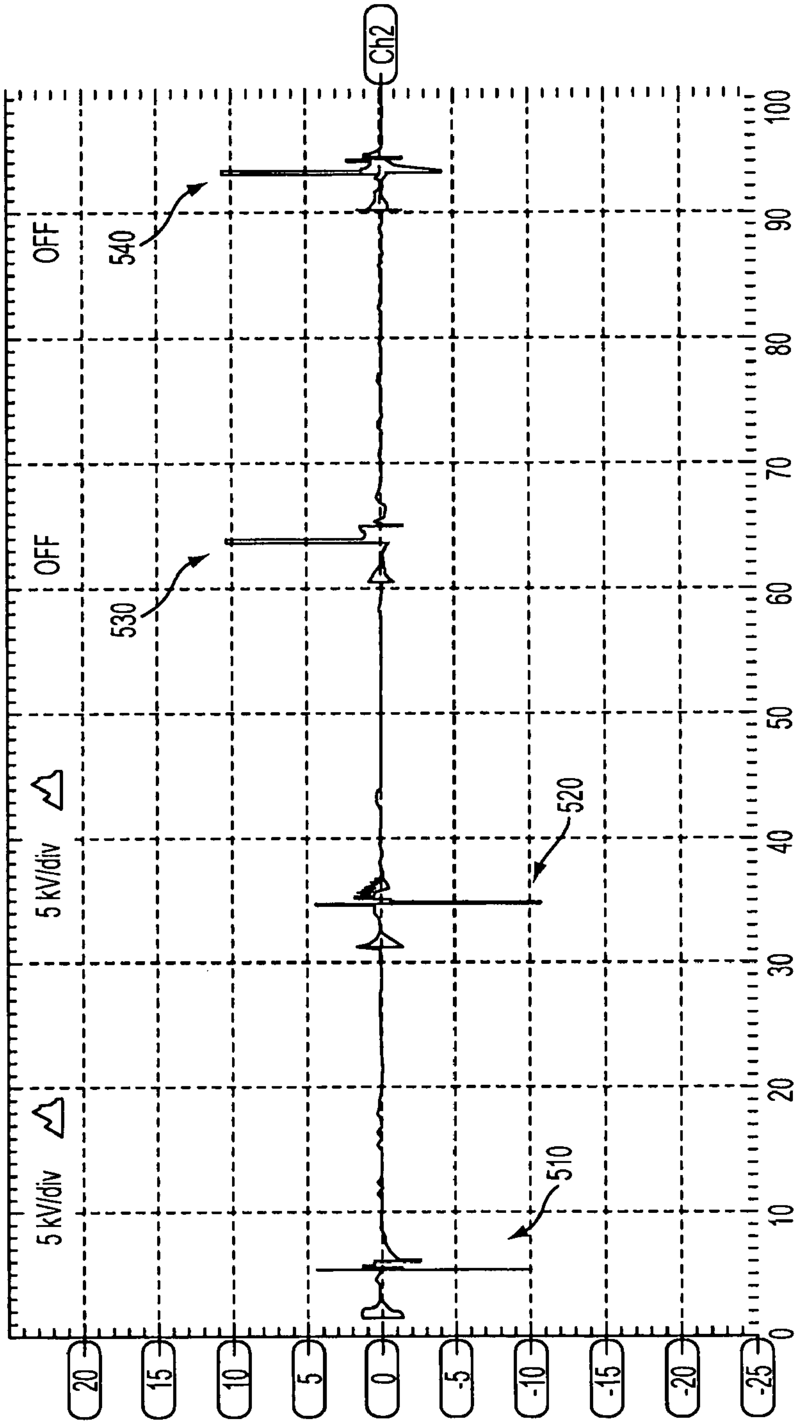
FIG. 5 shows a four cylinder parade display prior to Channel 1 inversion.

The MODIS™ system advantageously provides a display which indicates whether or not the sensors and the control box are properly connected. The negative going (when inverted) and positive going (if present) signals are set to −10 kV avg and +10 kV avg, respectively to provide an all positive going parade display, which along with the engine firing order, will indicate a suspicious cylinder if any firing line is abnormal. It is to be understood that up to 30% variation in firing line between cylinders is considered within normal parameters. FIG. 5 shows a typical four cylinder parade display, in which the waveform being displayed includes a sequential display of the waveforms of each cylinder and represents a complete cycle of the engine after Ch. 1 inversion. In FIG. 5, each of the firing line voltages 510, 520, 530, 540 substantially comports with one another and no problems are indicated by this parade pattern.

Once the system is set up and the parade pattern is displayed, the average negative going parade should be adjusted to a −10 kV average firing line using the appropriate pot (normally CNTRL A) then inverted. If a positive display is also showing (as for a DIS or DECOP), the positive going parade should be set for a +10 kV average firing line (normally CNTRL B). If the sensors are properly connected to the control box with the proper polarity, then any cylinder firing line whose amplitude deviates significantly from the average is a candidate for further investigation. In other words, the relative amplitude of the firing lines provides a simple indicator of COPs requiring further attention.

The embodiments described herein may be used with any desired ignition system or engine. Those systems or engines may comprises items utilizing organically-derived fuels or fossil fuels and derivatives thereof, such as gasoline, natural gas, propane and the like or combinations thereof. Those systems or engines may be utilized with or incorporated into another systems, such as an automobile, a truck, a boat or ship, a motorcycle, a generator, an airplane and the like.

Various aspects of the present concepts have been discussed in the present disclosure for illustrative purposes. It is to be understood that the concepts disclosed herein is capable of use in various other combinations and environments and is capable of changes or modifications within the scope of the concepts expressed herein. Moreover, although examples of the apparatus and method were discussed, the present concepts are not limited by the examples provided herein and additional variants are embraced by the claims appended hereto. As but one example, the capacitive elements could be hinged relative to one another and may comprise a tension spring at an end of each of the capacitive elements opposite to the hinge, wherein the capacitive elements may be angularly separated for placement about and securement to an ignition coil housing.

What is claimed is:

1. A capacitive sensor for a coil-on plug ignition testing apparatus, comprising:

a first portion of the capacitive sensor having at least one first engagement member projecting outwardly therefrom and a second portion of the capacitive sensor engageable with the first portion and configured to slide relative to the first portion, the second portion having at least one second engagement member projecting outwardly therefrom, at least one of the first portion and the second portion comprising a capacitive element;

a biasing element disposed between the first portion and the second portion to bias the first portion toward the second portion and to maintain the first portion and second portion in a contracted state; and an electrical connector electrically connecting the first or second portion forming the capacitive element to an output terminal, wherein at least one of the first portion and the second portion has a substantially planar base, and wherein the first portion may be translated relative to the second portion against a bias of the biasing element to an expanded state for securement of both the first and second portions to a coil-on plug housing.

2. A capacitive sensor for a coil-on plug ignition testing apparatus according to claim 1, wherein the first portion has a substantially planar base defining a slot or groove therein, and the second portion has a protruding member disposed to slide within the slot or groove and to maintain the second portion in sliding contact with the first portion.

3. A capacitive sensor for a coil-on plug ignition testing apparatus according to claim 2, wherein the biasing member is disposed between an upstanding first finger of the first portion and an upstanding second finger of the second portion.

4. A capacitive sensor for a coil-on plug ignition testing apparatus according to claim 3, wherein the biasing member is a spring.

5. A capacitive sensor for a coil-on plug ignition testing apparatus according to claim 4, further comprising a guide rod disposed along a longitudinal axis of the spring within the spring coil.

6. A capacitive sensor for a coil-on plug ignition testing apparatus according to claim 5, wherein the guide rod is rigidly connected to one of the first portion and the second portion and is slidingly connected to another one of the first portion and the second portion.

7. A capacitive sensor for a coil-on plug ignition testing apparatus according to claim 6, wherein the rigid connection of the guide rod to one of the first portion and the second portion forms a terminal for the electrical connector.

8. A capacitive sensor for a coil-on plug ignition testing apparatus according to claim 7, further comprising a non-conductive material applied to an exterior surface of at least a portion of at least one of the first portion and the second portion.

9. A coil-on plug ignition testing apparatus, comprising:

a capacitive sensor comprising a first region having at least one first engagement member projecting outwardly therefrom and a second region connected to the first region and configured to slide relative to the first region, the second region having at least one second engagement member projecting outwardly therefrom, at least one of the first region and the second region comprising a capacitive element, a biasing element disposed between the first region and the second region to bias the first region toward the second region and to maintain the first region and second region in a contracted state, and an electrical connector electrically connected to at least one of the first region and the second region forming the capacitive element, wherein at least one of the first region and the second region has a substantially planar base, and wherein the first region may be translated relative to the second region against a bias of the biasing element to an expanded state for securement to a coil-on plug housing, and a control circuit comprising a first circuit region comprising a plurality of input electrical connectors connectable to a first plurality of capacitive sensors, a second circuit region comprising a plurality of input electrical connectors connectable to a second plurality of capacitive sensors, the second circuit region provided parallel to the first circuit region, a first capacitor comprising a region of a capacitive divider provided in at least one of the first circuit region and the second circuit region, and a first potentiometer provided in series with the first circuit region and the second region for attenuation of signals input thereto.

10. A control module for a coil-on plug ignition testing apparatus according to claim 9, further comprising:

a first switch positionable in a first position and a second position;

wherein the first potentiometer is provided in series with the first circuit region and the second circuit region when the switch is in the first position to permit attenuation of signals input thereto.

11. A control circuit for a coil-on plug ignition testing apparatus according to claim 10, wherein:

the first circuit region comprises the first capacitor comprising a region of a capacitive divider when the switch is in the second position;

the second circuit region comprises a second capacitor comprising a region of another capacitive divider when the switch is in the second position;

the first potentiometer is provided in series to the first circuit region when the switch is in the second position to permit attenuation of signals input thereto; and a second potentiometer is provided in series to the second circuit region when the switch is in the second position to permit attenuation of signals input thereto.

* * * * *